(12) United States Patent
Piron et al.

(10) Patent No.: US 8,374,676 B2
(45) Date of Patent: Feb. 12, 2013

(54) CHEST WALL COIL ARRAY FOR BREAST IMAGING

(75) Inventors: Cameron Anthony Piron, Toronto (CA); Han Wang, Toronto (CA); Mariana Garcia Coni, Toronto (CA); Joshua Richmond, Toronto (CA); Jakub Jankowski, Toronto (CA); Chris Luginbuhl, Toronto (CA)

(73) Assignee: Hologic, Inc., Bedford, MA (US)

( * ) Notice: Subject to any disclaimer, the term of this patent is extended or adjusted under 35 U.S.C. 154(b) by 821 days.

(21) Appl. No.: 12/277,057

(22) Filed: Nov. 24, 2008

(65) Prior Publication Data

US 2009/0149738 A1 Jun. 11, 2009

Related U.S. Application Data

(60) Provisional application No. 60/989,893, filed on Nov. 23, 2007.

(51) Int. Cl.
*A61B 5/05* (2006.01)
(52) U.S. Cl. ........................................ 600/415; 600/422
(58) Field of Classification Search .......... 600/407–435; 382/130–132
See application file for complete search history.

(56) References Cited

U.S. PATENT DOCUMENTS

| | | | | |
|---|---|---|---|---|
| 5,590,655 A * | 1/1997 | Hussman | ....................... | 600/426 |
| 6,261,299 B1 * | 7/2001 | Chakeres | ....................... | 606/130 |
| 6,389,837 B1 * | 5/2002 | Morozumi | ................... | 62/324.6 |
| 6,423,076 B1 * | 7/2002 | Cardwell et al. | ............... | 606/130 |
| 6,675,037 B1 * | 1/2004 | Tsekos | .......................... | 600/417 |
| 6,889,073 B2 * | 5/2005 | Lampman et al. | ............ | 600/422 |
| 7,034,530 B2 * | 4/2006 | Ahluwalia et al. | ............ | 324/309 |
| 7,597,104 B2 * | 10/2009 | Zheng et al. | ................... | 128/869 |
| 7,711,407 B2 * | 5/2010 | Hughes et al. | ................. | 600/417 |
| 7,826,883 B2 * | 11/2010 | Hibner et al. | ................. | 600/407 |
| 7,831,290 B2 * | 11/2010 | Hughes et al. | ................. | 600/411 |
| 7,840,277 B2 * | 11/2010 | Matos | ............................. | 607/60 |
| 7,862,517 B2 * | 1/2011 | Tsonton et al. | ................ | 600/567 |
| 2001/0039378 A1 * | 11/2001 | Lampman et al. | ............ | 600/410 |
| 2002/0156365 A1 * | 10/2002 | Tsekos | ......................... | 600/411 |
| 2003/0199753 A1 * | 10/2003 | Hibner et al. | ................. | 600/411 |
| 2003/0199785 A1 * | 10/2003 | Hibner et al. | ................. | 600/562 |
| 2004/0077972 A1 * | 4/2004 | Tsonton et al. | ................ | 600/564 |
| 2004/0211477 A1 * | 10/2004 | Ezaki et al. | .................... | 137/877 |
| 2005/0080333 A1 * | 4/2005 | Piron et al. | .................... | 600/417 |
| 2005/0245805 A1 * | 11/2005 | Hoppel et al. | ................. | 600/407 |
| 2005/0261581 A1 * | 11/2005 | Hughes et al. | ................. | 600/434 |
| 2006/0241385 A1 * | 10/2006 | Dietz | ............................ | 600/415 |
| 2006/0270930 A1 * | 11/2006 | Brasile | ......................... | 600/410 |
| 2007/0016003 A1 * | 1/2007 | Piron et al. | .................... | 600/415 |
| 2007/0108980 A1 * | 5/2007 | Adriany et al. | ............... | 324/318 |
| 2007/0255170 A1 * | 11/2007 | Hibner et al. | ................. | 600/564 |
| 2008/0015429 A1 * | 1/2008 | Tsonton et al. | ................ | 600/414 |
| 2008/0071164 A1 * | 3/2008 | Pogue et al. | .................. | 600/411 |
| 2008/0077005 A1 * | 3/2008 | Piron et al. | .................... | 600/411 |
| 2008/0132785 A1 * | 6/2008 | Piron et al. | .................... | 600/426 |
| 2008/0214930 A1 * | 9/2008 | Brasile | ......................... | 600/422 |
| 2008/0230074 A1 * | 9/2008 | Zheng et al. | ................... | 128/869 |
| 2008/0255443 A1 * | 10/2008 | Piron et al. | .................... | 600/410 |
| 2009/0149738 A1 * | 6/2009 | Piron et al. | .................... | 600/422 |
| 2009/0156961 A1 * | 6/2009 | Tsonton et al. | ................ | 600/562 |
| 2009/0163830 A1 * | 6/2009 | Hibner et al. | ................. | 600/567 |

(Continued)

*Primary Examiner* — Sanjay Cattungal (57) ABSTRACT

A RF coil array is provided for imaging a chest wall of a patient including a breast. The RF coil array includes a rigid cup-shaped element and a flexible, substantially flat portion. The rigid cup-shaped element is sized and dimensioned to receive a small breast, such as a post mastectomy breast or a male breast, and the flexible portion is configured to be conformed to the patient adjacent the breast to allow for imaging of the breast, and adjacent areas while facing the chest wall.

10 Claims, 11 Drawing Sheets

U.S. PATENT DOCUMENTS

2009/0216110 A1* 8/2009 Piron et al. .................. 600/415
2009/0259122 A1* 10/2009 Larson et al. ................ 600/411
2009/0281453 A1* 11/2009 Tsonton et al. .............. 600/567
2011/0015517 A1* 1/2011 Hughes et al. ............... 600/415

* cited by examiner

CHEST WALL COIL ARRAY FOR BREAST IMAGING

CROSS-REFERENCE TO RELATED APPLICATIONS

This application claims the benefit of U.S. Provisional Application No. 60/989,893, filed Nov. 23, 2007, which is hereby incorporated by reference.

FIELD OF THE INVENTION

This invention relates generally to Magnetic Resonance Imaging (MRI) systems, and more particularly, to Radio-Frequency (RF) coils in MRI systems for use in breast imaging.

BACKGROUND

Breast cancer affects the lives of more than 180,000 women in the United States each year, and is one of the leading causes of death in women. As a result, early detection is important, and screening of all women is encouraged. Efficient and effective methods for screening are therefore a significant goal in the health care industry.

Diagnosis and treatment by noninvasive MRI is one method that has been shown to greatly enhance both detection, and survival of breast cancer. In conventional breast MRI, a local "breast" RF coil is utilized to receive signals from breast tissues being examined. Breast coils, however, are typically designed to image the breast in a prone position, and to provide a uniform signal to noise ratio over a large volume of interest corresponding to a statistically large breast size.

These coils are specifically constructed to image a predetermined volume of tissue comprising a predetermined quantity of salty water calculated based on the size of a normal breast. While suitable for imaging in these applications, however, RF coils designed for normal breasts have a significantly reduced signal to noise ratio when applied to breasts that are small in size, such as those which have been surgically altered due to full or partial mastectomy, and male breasts. To increase the signal-to-noise ratio, it is desirable to customize the coils to the size and shape of individual breasts. The present invention addresses these issues.

SUMMARY OF THE INVENTION

The present invention provides a coil array for immobilizing the tissue to be imaged against the chest wall of a patient. The coil array comprises a flexible mounting element, an RF coil array formed on the mounting element, and a rigid cup-shaped element coupled to the flexible mounting element. The rigid cup-shaped element is sized and dimensioned to receive a breast while facing the chest wall of the patient, and the flexible mounting element is configured to be flexed to position the flexible mounting element adjacent the patient.

In another aspect, the present invention provides a kit for breast imaging, the kit comprising a chest wall coil array and a lateral array. The chest wall coil array comprises a flexible mounting element, an RF coil array formed on the flexible mounting element, and a rigid cup-shaped element coupled to the flexible mounting element. The rigid cup-shaped element is sized and dimensioned to receive a breast while facing the chest wall of the patient, and to be flexed to position the flexible mounting element adjacent the patient and to immobilize the tissue of the patient using compression. The lateral array comprises a substantially flat mounting element and an RF coil array formed on the mounting element. The chest wall coil array is configured to immobilize tissue in all directions using compression substantially perpendicular to a chest wall of a patient including a breast, and the lateral array is configured for immobilizing breast tissue in all directions using compression in the medial-lateral direction adjacent to the chest wall.

The foregoing and other aspects of the invention will appear in the detailed description which follows. In the description, reference is made to the accompanying drawings which illustrate a preferred embodiment of the invention.

BRIEF DESCRIPTION OF THE DRAWINGS

FIG. 10 is a side view of the patient support and mastectomy coil assembly;

DETAILED DESCRIPTION

Figure 1:
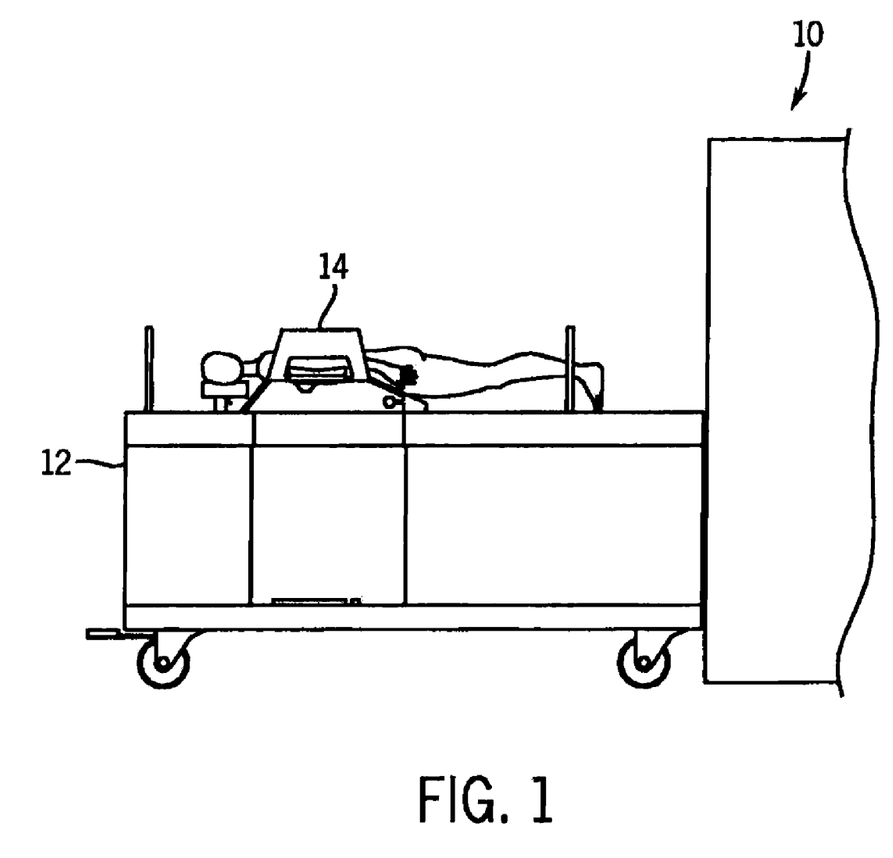
FIG. 1 is a perspective view of a patient positioned on a patient support adjacent a MRI system.
Figure 2:
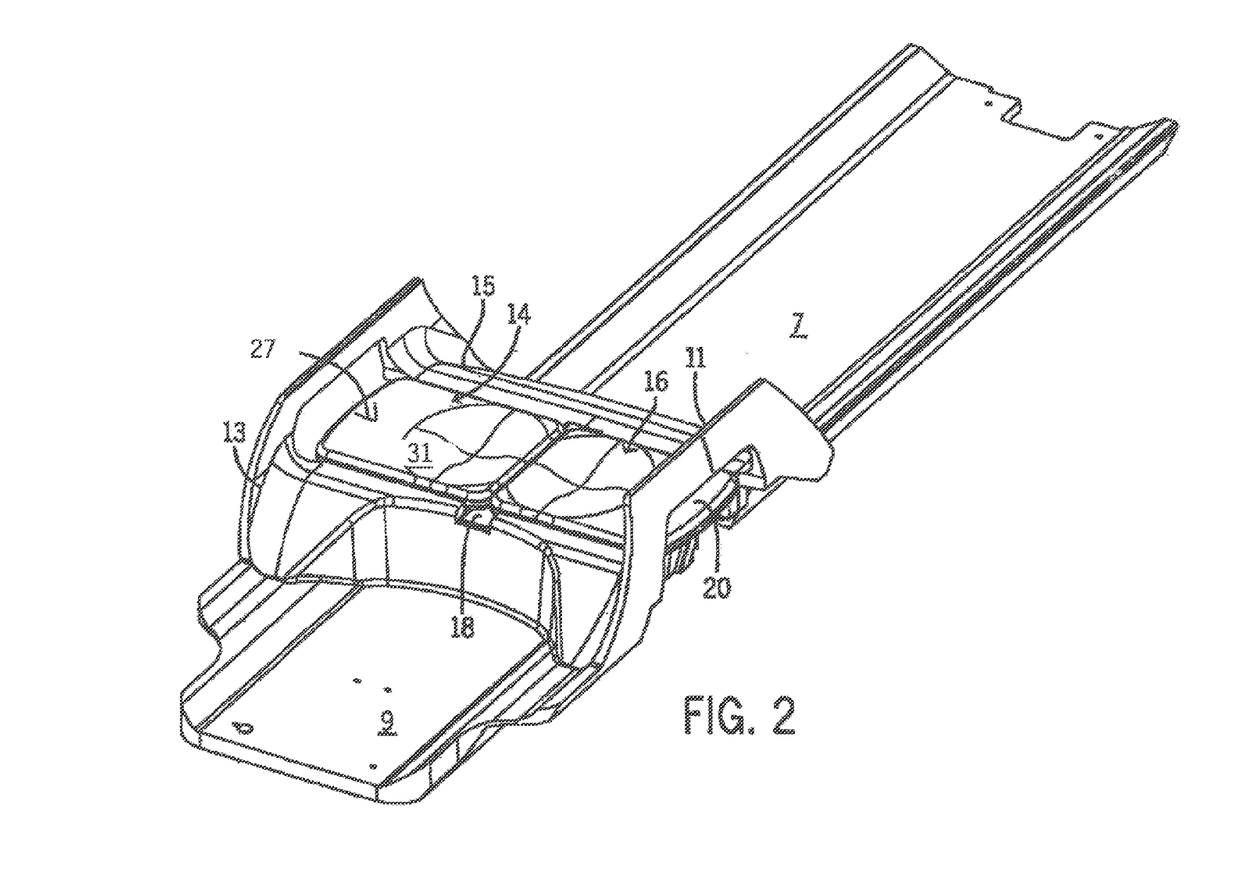
FIG. 2 is a perspective view of a patient support of FIG. 1 including a mastectomy coil assembly.

Referring now to the figures and more particularly to FIG. 1, a patient is shown as supported on a patient support structure 14 which is positioned on a patient transport 12 adjacent an MRI scanner 10. From the patient transport 12 the patient can be moved into the bore of the MRI scanner for imaging. The patient support structure 14, as shown here, allows the patient to lie face down with the breasts positioned adjacent RF coils for imaging, as described more thoroughly below. Referring now to FIG. 2, specifically, the patient support structure 14 consists of a head support area 9 and a lower patient support 7, with an interventional opening 27 defined between, and positioned to receive RF coils for imaging the breasts of the patient. Two arches 11 extend laterally along the opening, connecting the head support 9 to the lower patient support 7, providing structure while maximizing the ability of medical personnel to access the breasts of a patient supported on the patient support structure 14. The patient support structure 14 further includes a ramp 13 ramping upward from the head support 9 and towards the interventional opening 27, and a ramp 15 extending from the opening 27 toward the lower patient support 7. The patient support structure 14 is described more fully in U.S. Pat. No. 7,379,769, issued on May 27, 2008, which is hereby incorporated by reference for its description of this device.

Referring now to FIGS. 2 through 5, the patient support structure 14 and the interventional opening 27 of the patient support structure 14 are sized and dimensioned to receive first and second chest wall coil arrays 16 and 20, and a medial coil array 18, which are connected to the patient support structure as discussed more fully below. Referring now specifically to the exploded view of FIG. 5, the mastectomy coil arrays 16 and 20 each include a base 25 and an upper housing 17, which are constructed of a flexible, bendable material such as foam. The upper housing 17 includes a cup-shaped portion, formed by a rigid cup-shaped member 31, for receiving a breast, and a flexible portion 29 which can be, as shown here, generally flat. The cup-shaped member 31 is sized specifically to receive a small breast, particularly a post-mastectomy breast or a male breast. The flexible portion 29, as described below, can be bent to form the RF coil array 16 or 20 to the breast for imaging, and provides the ability to image areas around the breast, such as the arm pit and adjacent locations, which may be clinically relevant to a cancer diagnosis. An RF antenna or array of RF antennas 23 is coupled between the base portion 25 and upper housing 17. The RF antenna 23, therefore, is positioned to be directed toward the chest wall of the patient when the patient is positioned on the patient support structure 14 as shown in FIG. 1. The flexible portion 29 bends in at least one plane, and may be predisposed to bend in a particular direction because of long thin grooves running the whole length along the non-bending direction. Coils are arranged to provide imaging coverage of breast tissue, and may also be arranged to provide additional coverage of the medial steinum and axilla.

Figures 3, 4:
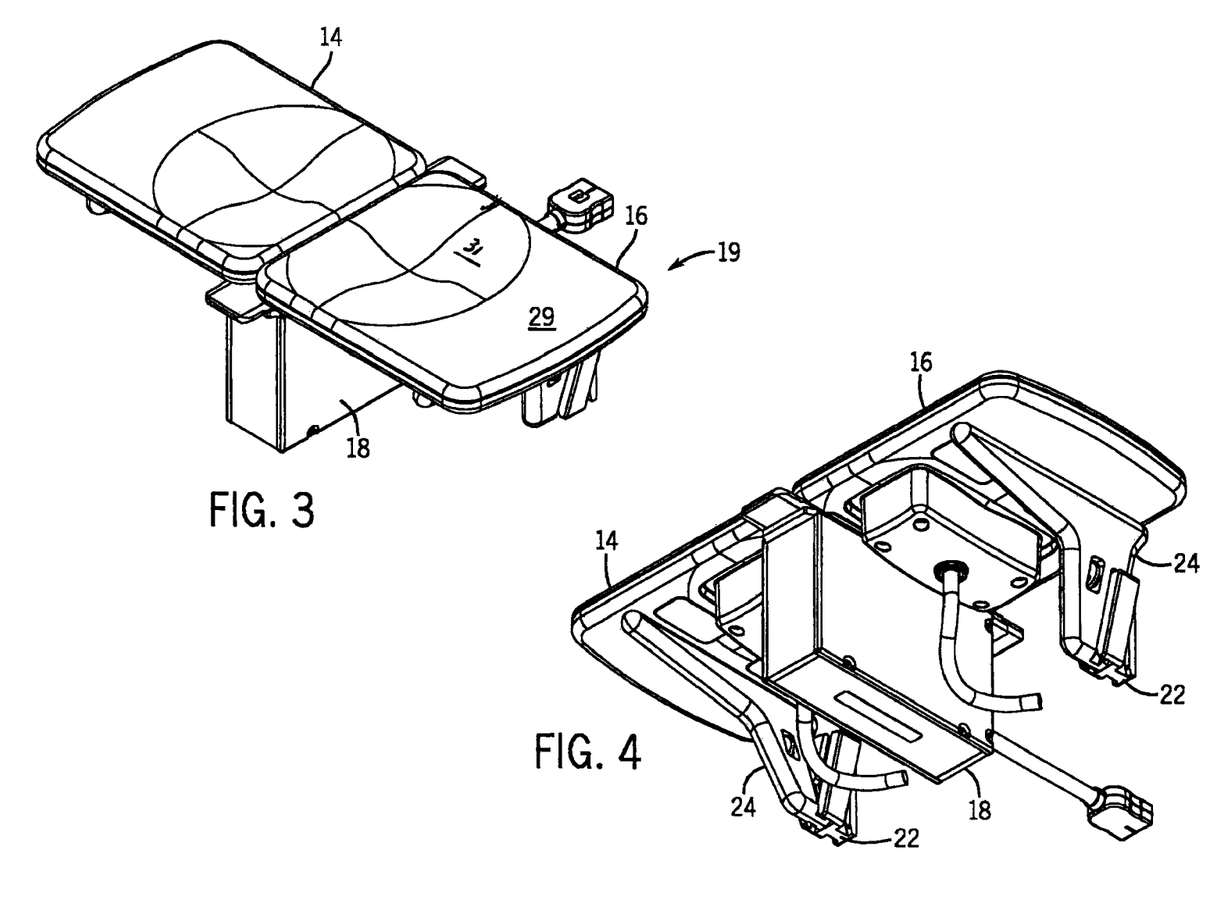
FIG. 3 is a top view of the mastectomy coil assembly.
FIG. 4 is a bottom view of the mastectomy coil assembly.
Figure 5:
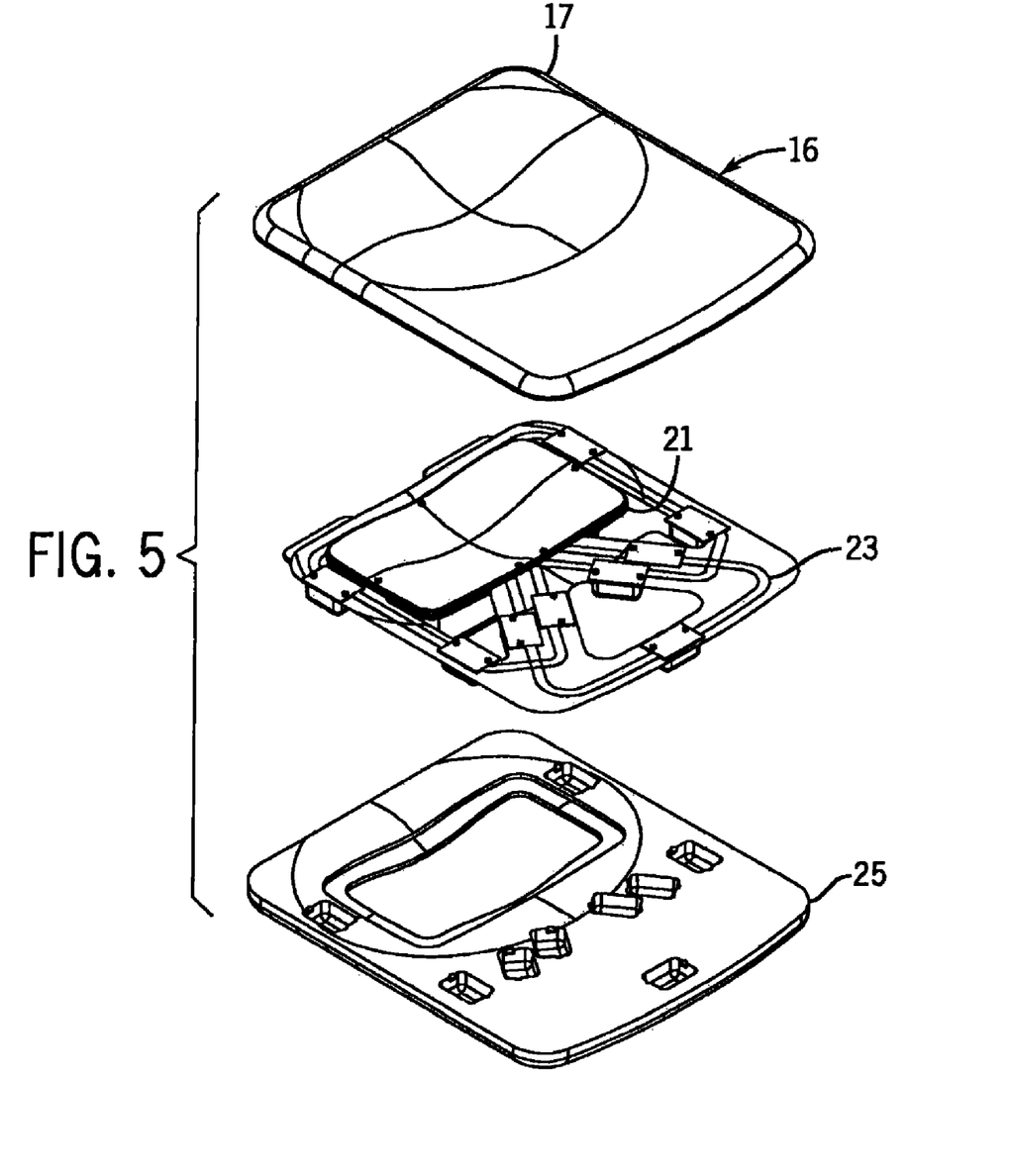
FIG. 5 is an exploded view of a mastectomy RF coil array for use in the mastectomy coil assembly of FIG. 4.

Referring still to FIGS. 2-4, and now particularly to FIG. 4, a bottom view of the assembly 19 is shown. To adjust the position of the RF antennas 23 relative to the position of a breast received in the cup-shaped portion 31 of the RF coil arrays 16 and 20, a moveable adjustment arm 24 is positioned beneath and adjacent the flexible portion 29 of the coil array 16. The moveable adjustment arm 24 is adjustable vertically along a vertical track 22, and is further adjustable laterally along a lateral track 26, as discussed more fully below, to allow positioning of the flexible portion 29 adjacent a breast and associated clinically relevant areas around the breast for imaging.

Figure 11:
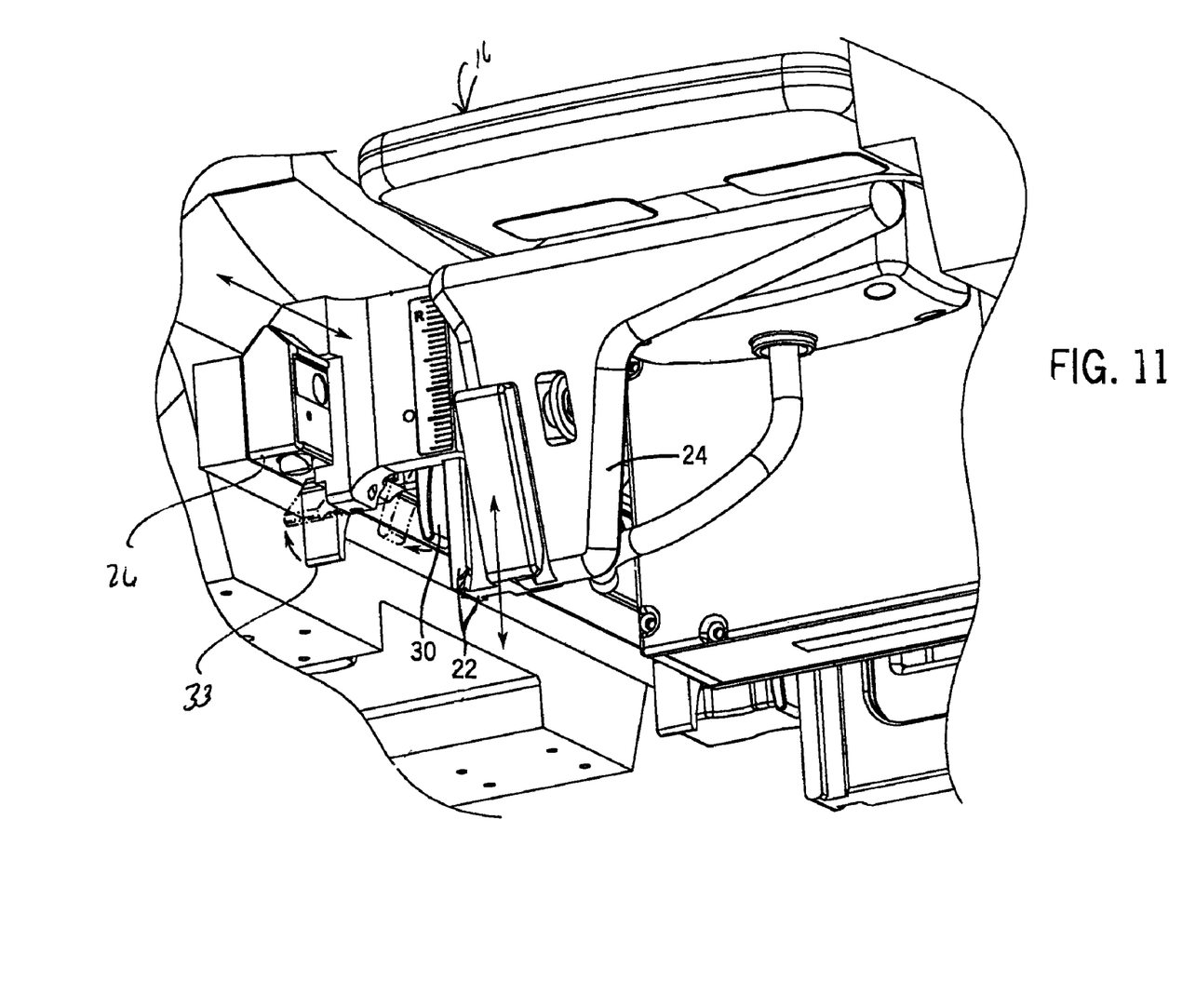
FIG. 11 is a perspective view of an underside of the patient support, illustrating in particular lateral and vertical sliding elements for adjusting the mastectomy coil assembly.

Referring now to FIG. 11, a perspective view of the moveable adjustment arm 24 is shown positioned adjacent the coil 16. The moveable adjustment arm 24 is moveable vertically along the vertical track 22 which, as shown here, can be an I-shaped beam. The vertical track 22 is coupled to a lateral sliding element 32 which is dimensioned to be received on a lateral track 26. In operation, therefore, the vertical track 22 moves along the lateral track 26, such that the moveable adjustment arm 24 is moveable in two dimensions to position the flexible portion 29 of the coil array 16. Once the coil array 16 is appropriately positioned, latching devices 30 and 33 can be activated to lock the flexible portion 29 in position by pressing it up against the patient. The latching devices 30 and 33 are cams, which immobilize the sliding elements with friction.

Figure 6:
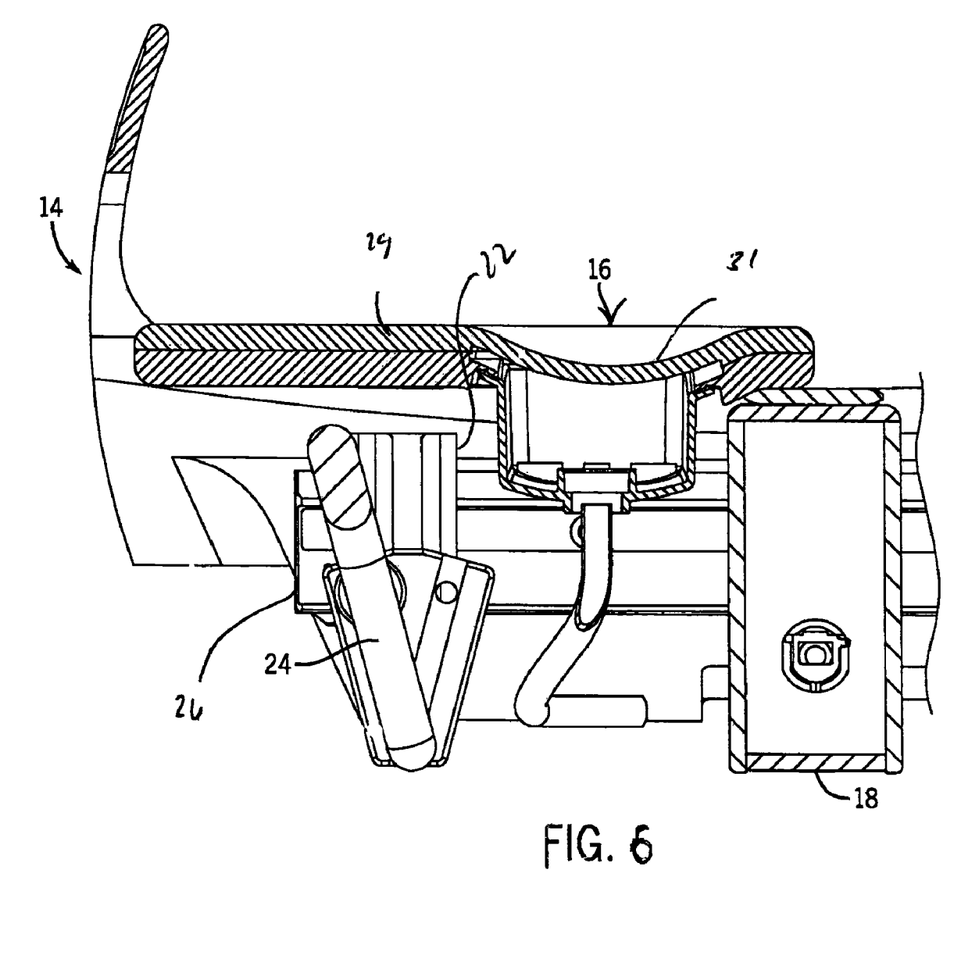
FIG. 6 is a cutaway view of the patient support and top view of the mastectomy coil assembly.
Figure 7:
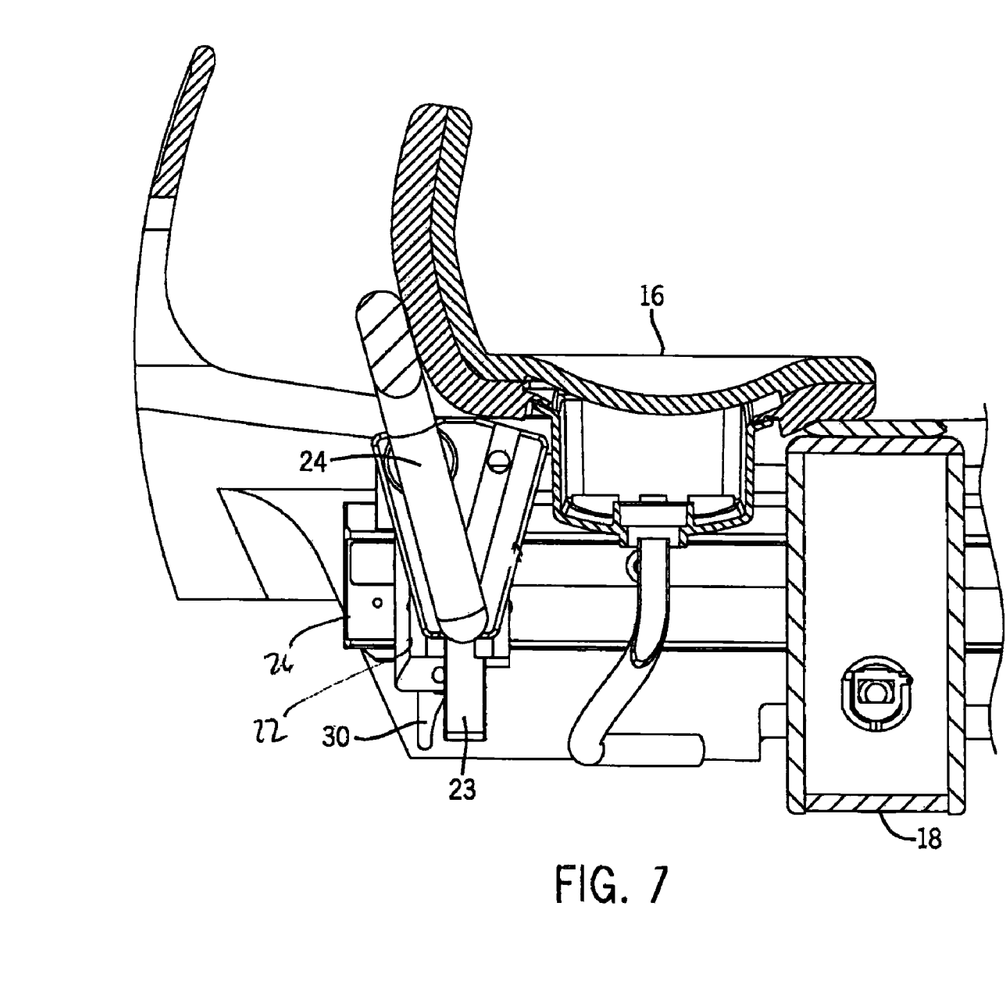
FIG. 7 is a portion of a cutaway view of the patient support illustrating the mastectomy coil array, wherein a portion of the array is adjusted vertically upward to form to a breast.
Figure 8:
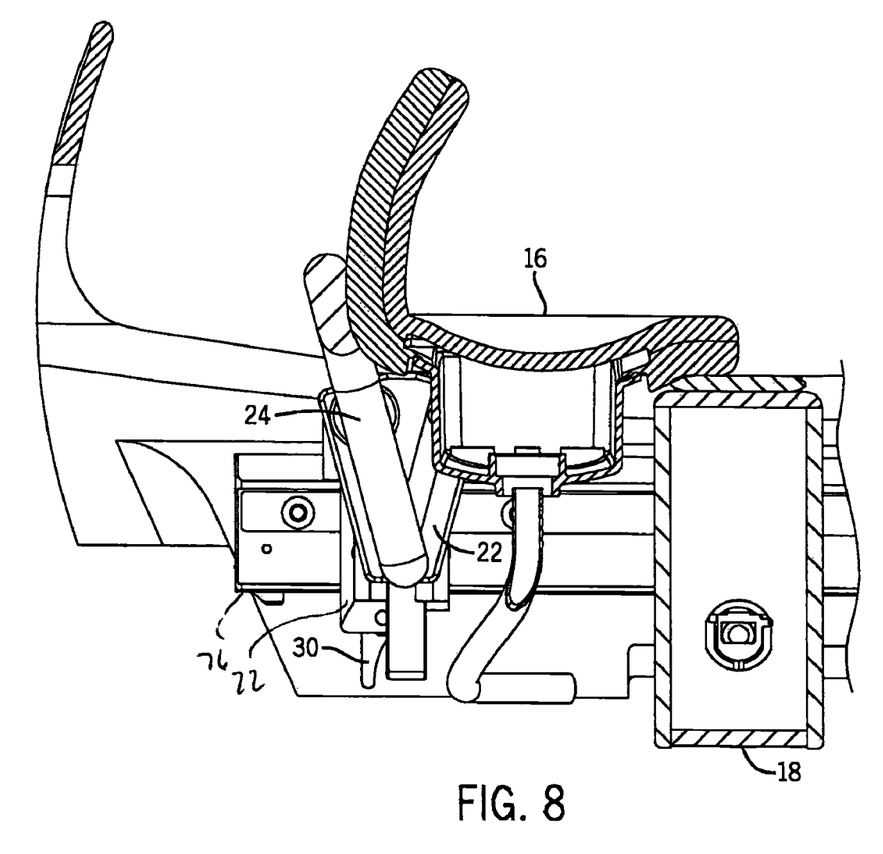
FIG. 8 is a portion of a cutaway view of the patient support illustrating the mastectomy coil array adjusted both vertically and laterally to form to a breast.

Referring now to FIGS. 6-8, a series of cutaway views of the assembly 19 as positioned in the patient support 14 is shown, with the position of the moveable adjustment arm 24 located in a neutral position (FIG. 6), adjusted vertically to an elevated position (FIG. 7), and adjusted both laterally and vertically (FIG. 8). Referring first to FIG. 6, in the neutral position, the moveable adjustment arm 24 is positioned adjacent a bottom surface of the coil array 16, and portion 29 of the coil array 16 is substantially flat.

Referring now to FIG. 7, to form the coil array 16 to the breast, the moveable adjustment arm 24 is moved vertically along track 22 to an elevated position. As the moveable adjustment arm 24 is elevated along the track 22, the flexible portion 29 of the coil array 16 is bent upward, where it can be formed alongside of the breast, and adjacent the arm pit of the patient.

Referring now to FIG. 8 and also to FIG. 10, the flexible portion 29 is shown adjusted laterally. As shown here, and as discussed above, the moveable adjustment arm 24 is further mounted to a lateral sliding element 32, such that the arm 24 can be moved laterally to the right and left. After the arm 24 is elevated to a selected position as shown in FIG. 7, the arm 24 can be moved laterally toward the breast of the patient as shown here. As described above, as the arm 24 is repositioned, the flexible portion 29 is again bent toward the breast of the patient, to compress against the tissue of the patient and to provide improved imaging.

Figure 9:
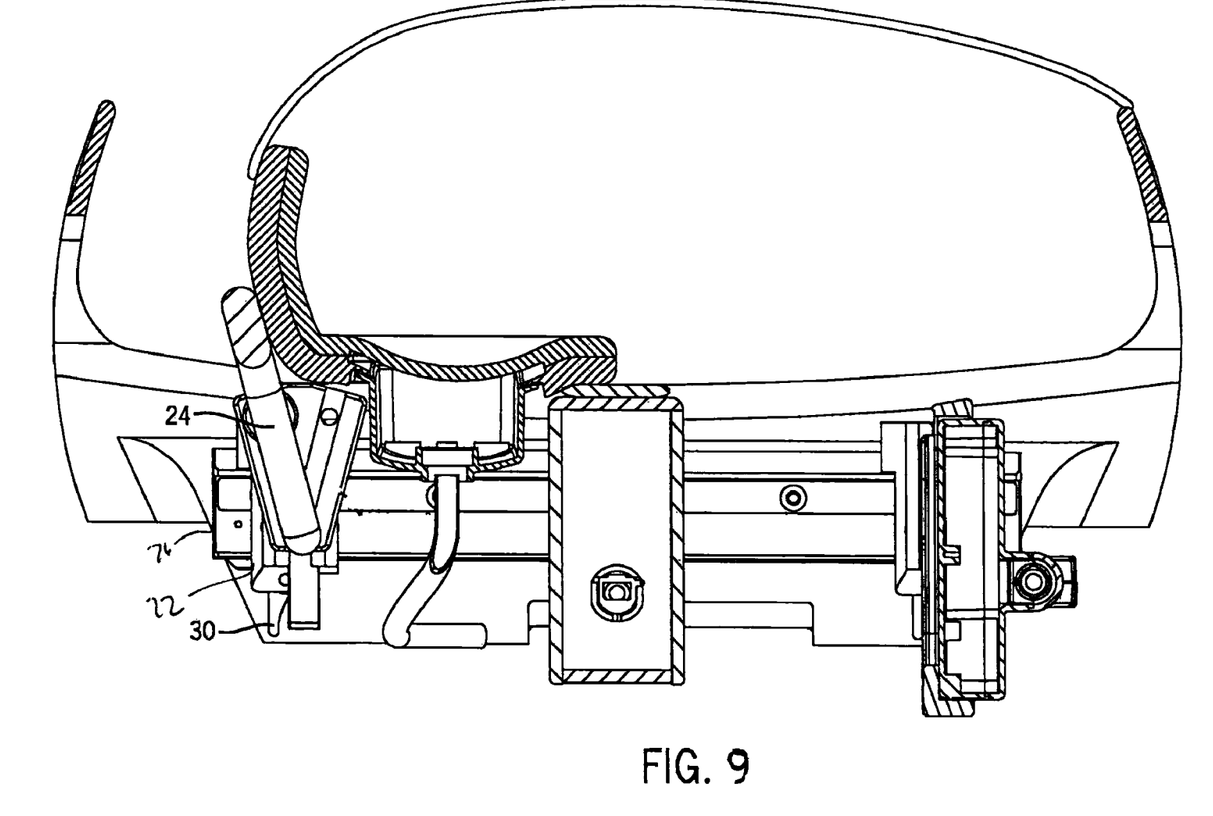
FIG. 9 is an expanded view of the patient support of FIG. 8 including a strap for locking the support in position.

Referring now to FIG. 9, to retain the coil array 16 in the selected position, and to assure a tight fit between the array and the anatomy of interest, a strap 34, belt, or other device can be provided. As shown here, the strap 34 can be connected at one end to an arched portion of the patient support 14, and at the opposing end to a RF coil array 16. The locking mechanism can be, for example, a hook and loop type fastener such as Velcro®. Other types of locking and latching devices, including buckles, latches, buttons, or other devices can also be used. In alternative embodiments, the strap 34 can be secured encircling the patient without the support of the arched portion of the patient support 14. In addition to or instead of the strap 34 and arm 24 mentioned above, the flexible portion 29 can be bent into and retain a curved or angled shape relative to the cup shaped member 31 by having plasticly deformable elements affixed to or embedded in the flexible portion 29 and cup shaped member 31. It is preferable that these plastically deformable elements are made from copper or one of its alloys.

Figure 12:
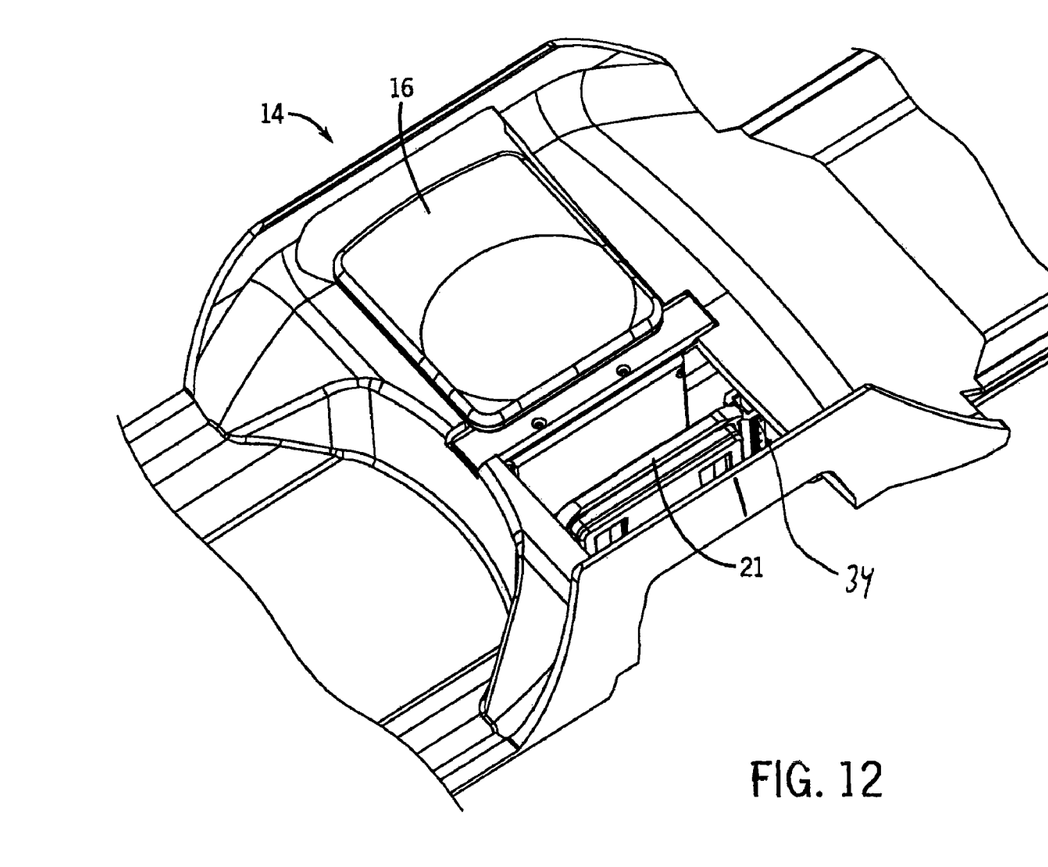
FIG. 12 is a perspective view of the patient support and mastectomy coil assembly.
Figure 16:
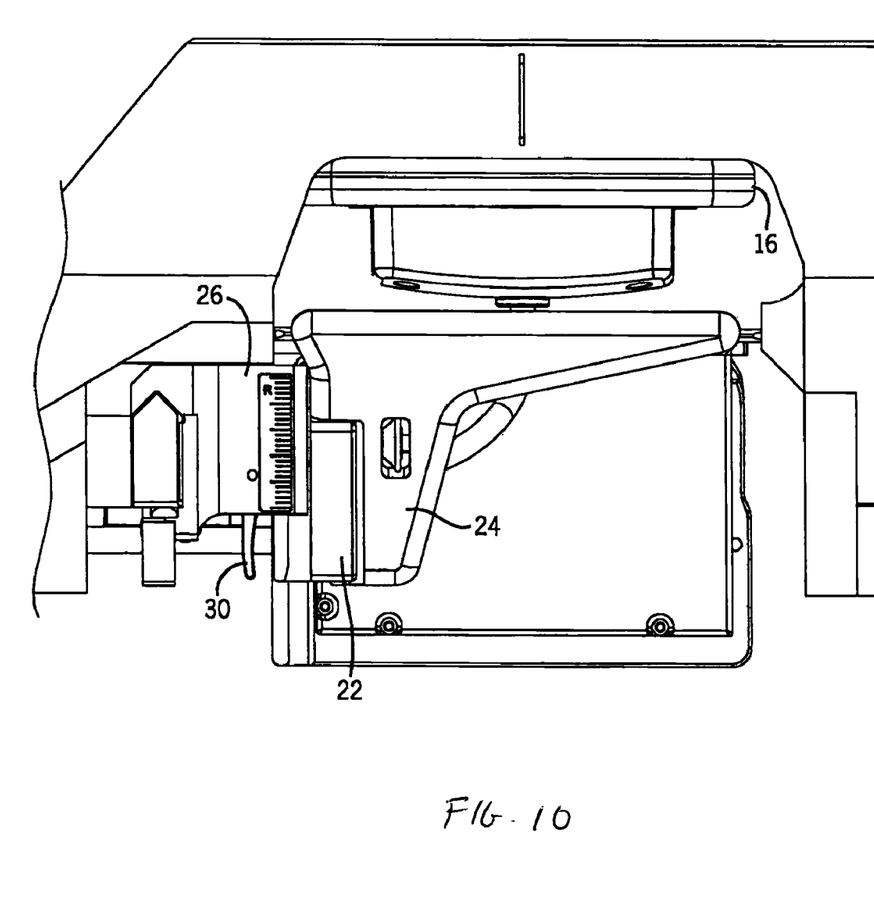

Referring now to FIGS. 9 and 12, the patient support structure 14 can be configured to include both a chest wall coil array 16 and a lateral coil 21 on opposing sides. This configuration is useful, for example, when imaging patient that has had a mastectomy on one side, and has a normal sized breast on an opposing side. Here, the RF coil array 16 configured for imaging while facing the chest wall of the patient is mounted on a first side of the patient support structure 14, as described above. A second RF coil or coil array 21, comprising an RF antenna or an array of RF antennas in a frame structure, is coupled to the patient support structure 14 in a mounting structure 34 configured to slidably receive the RF coil array 21. The mounting structure 34 can, as described above with reference to the coil array 16, be coupled to the lateral track 26, to allow the coil array 21 to be positioned adjacent the breast of the patient, and used in conjunction with compression plates and other devices. Lateral arrays of this type are described more fully in U.S. Pat. No. 7,379,769, issued on May 27, 2008, which is incorporated by reference for its description of this device, In one embodiment of the invention, the chest wall coil arrays 16 are provided in combination with lateral coil arrays, such as coil array 21, in a kit. A kit of this type allows an operator to interchange the appropriate coils in the patient support structure 14 to provide appropriate imaging for various patients. Thus, for example, a pair of coil arrays 21 can be used for a woman with normal breasts, a pair of coil arrays 16 for a woman who has had a double mastectomy, and one coil array 21 and another coil array 16 for a woman who has had a single mastectomy. A kit might also include various coil arrays 16 in which the size of the cup-shaped member 31 varies to allow the size of the member 31 to be matched to the breast.

It should be understood that the methods and apparatuses described above are only exemplary and do not limit the scope of the invention, and that various modifications could be made by those skilled in the art that would fall under the scope of the invention. For example, although a specific set of vertical and lateral elements is described above for bending the flexible portion of the RF coil 16, and for locking the coil in position, it will be apparent to those of ordinary skill in the art that there are other types of sliding elements that could be used in this application. Furthermore, although sliding elements are shown to bend the coil to an appropriate position, the coil can be constructed of a material that maintains its shape when bent, and which can be repeatedly bent to a new position as required. Various other modifications will be apparent to those of ordinary skill in the art. To apprise the public of the scope of this invention, the following claims are made:

We claim:

1. A coil array for immobilizing the tissue to be imaged against the chest wall of a patient, the coil array comprising:
    a flexible mounting element;
    an RF coil array formed on the flexible mounting element;
    a rigid cup-shaped element coupled to the flexible mounting element, wherein the rigid cup-shaped element is sized and dimensioned to receive a breast while facing the chest wall of the patient, and wherein the flexible mounting element is configured to be bent to position the RF coil adjacent to the patient; and
    an adjustment device positioned adjacent the flexible mounting element, and configured to bend the flexible mounting element to conform to the body of the patient adjacent the breast, wherein the adjustment device is receivable in a patient support structure and is configured to move laterally along a lateral track provided in the patient support structure.

2. The coil array as recited in claim 1, wherein the flexible mounting element includes a generally flat flexible portion adjacent the rigid cup-shaped element.

3. The coil array as defined in claim 1, wherein the adjustment device is coupled to a vertical track and is configured to move along the vertical track.

4. The coil array as defined in claim 3, wherein the vertical track is coupled to the lateral track.

5. The coil array as defined in claim 1, wherein the flexible mounting element is comprises a material that can be bent into and retain a position adjacent an anatomy of interest in the patient.

6. A kit for breast imaging, the kit comprising:
    a chest wall coil array comprising:
    a flexible mounting element;
    an RF coil array formed on the flexible mounting element;
    an adjustment device positioned adjacent the flexible mounting element, and configured to bend the flexible bending element to conform a body of a patient adjacent a breast, wherein the adjustment device is mounted to be moveable vertically and laterally, to bend the chest wall array in two dimensions; and
    a rigid cup-shaped element coupled to the flexible mounting element, wherein the rigid cup-shaped element is sized and dimensioned to receive the breast while facing the chest wall of the patient, and wherein the flexible mounting element is configured to be bent to position the RF coil adjacent the patient and to immobilize the tissue of the patient using compression; and
    a lateral array comprising:
    a substantially flat mounting element;
    an RF coil array formed on the mounting element;
    wherein the chest wall coil array is configured for immobilization of tissue in all directions using compression substantially perpendicular to the chest wall of the patient including the breast, and the lateral array is configured for immobilizing breast tissue in all directions using compression in the medial-lateral direction adjacent to the chest wall.

7. A coil array for immobilizing the tissue to be imaged against the chest wall of a patient, the coil array comprising:
    a flexible mounting element;
    an RF coil array formed on the flexible mounting element;
    a rigid cup-shaped element coupled to the flexible mounting element, wherein the rigid cup-shaped element is sized and dimensioned to receive a breast while facing the chest wall of the patient, and wherein the flexible mounting element is configured to be bent to position the RF coil adjacent to the patient; and
    an adjustment device positioned adjacent the flexible mounting element, and configured to bend the flexible mounting element to conform to the body of the patient adjacent the breast, wherein the adjustment device is coupled to a vertical track and is configured to move along the vertical track.

8. The coil array as recited in claim 7, wherein the flexible mounting element includes a generally flat flexible portion adjacent the rigid cup-shaped element.

9. The coil array as defined in claim 7, wherein the adjustment device is receivable in a patient support structure and is configured to move laterally along a lateral track provided in the patient support structure.

10. The coil array as defined in claim 7, wherein the flexible mounting element is comprises a material that can be bent into and retain a position adjacent an anatomy of interest in the patient.

\* \* \* \* \*